United States Patent
Schwenkschuster et al.

(10) Patent No.: US 7,679,100 B2
(45) Date of Patent: Mar. 16, 2010

(54) HOUSING FOR AN ELECTROMAGNETIC RADIATION EMITTING OPTOELECTRONIC COMPONENT, COMPONENT AND METHOD OF MAKING A HOUSING OR A COMPONENT

(75) Inventors: Lukas Schwenkschuster, Burgstetten (DE); Martin Wüller, Warendorf (DE); Joachim Reill, Zeitlarn (DE); Moritz Engl, Regensburg (DE)

(73) Assignees: Osram Opto Semiconductors GmbH, Regensburg (DE); Hella KGAA Hueck & Co., Lippstadt (DE)

( * ) Notice: Subject to any disclaimer, the term of this patent is extended or adjusted under 35 U.S.C. 154(b) by 664 days.

(21) Appl. No.: 11/526,550

(22) Filed: Sep. 25, 2006

(65) Prior Publication Data

US 2007/0086148 A1    Apr. 19, 2007

(30) Foreign Application Priority Data

Sep. 30, 2005    (DE) ............... 10 2005 047 153
Dec. 13, 2005    (DE) ............... 10 2005 059 524

(51) Int. Cl.
*H01L 33/00* (2006.01)
(52) U.S. Cl. .................. 257/100; 257/79; 257/98; 257/99; 257/659; 257/E31.001; 257/E31.038; 257/E33.058; 257/E33.068; 257/E33.072; 362/84; 362/613; 438/22; 438/47; 438/48
(58) Field of Classification Search .......... 257/98, 257/99, 100; 438/22, 47, 48; 362/84, 613
See application file for complete search history.

(56) References Cited

U.S. PATENT DOCUMENTS

| 3,780,357 | A | 12/1973 | Haitz |
| 4,822,536 | A | 4/1989 | Voinis et al. |
| 5,040,868 | A | 8/1991 | Waitl et al. |
| 6,616,862 | B2 | 9/2003 | Srivastava et al. |
| 6,645,783 | B1 | 11/2003 | Brunner et al. |
| 6,670,748 | B2 | 12/2003 | Ellens et al. |
| 7,064,480 | B2 | 6/2006 | Bokor et al. |
| 7,223,024 | B2 * | 5/2007 | Fincato .......... 385/88 |
| 2003/0164537 | A1 | 9/2003 | Brunner et al. |
| 2004/0061433 | A1 | 4/2004 | Izuno et al. |

(Continued)

FOREIGN PATENT DOCUMENTS

DE    100 25 774    12/2001

(Continued)

OTHER PUBLICATIONS

International Search Report dated Jan. 31, 2007.

(Continued)

*Primary Examiner*—Dao H Nguyen
(74) *Attorney, Agent, or Firm*—Fish & Richardson P.C.

(57) ABSTRACT

A housing for an electromagnetic radiation emitting optoelectronic component is specified. The housing comprises a housing base body provided with a recess in which at least one chip mounting surface is disposed. At least one outer surface of the housing base body, disposed on an emission side of the housing and adjoining the recess, is provided with a baffle layer suitable for screening an electromagnetic radiation. An electromagnetic radiation emitting component provided with such a housing and a method of making a corresponding housing or component are also specified.

25 Claims, 4 Drawing Sheets

U.S. PATENT DOCUMENTS

| | | |
|---|---|---|
| 2004/0062699 A1 | 4/2004 | Oshio |
| 2004/0082098 A1 | 4/2004 | Schmid |
| 2006/0226419 A1 | 10/2006 | Birnstock et al. |
| 2006/0267042 A1* | 11/2006 | Izuno et al. .............. 257/100 |

FOREIGN PATENT DOCUMENTS

| | | |
|---|---|---|
| DE | 100 36 940 | 2/2002 |
| DE | 10059498 | 6/2002 |
| DE | 101 47 040 | 4/2003 |
| DE | 103 15 131 | 10/2004 |
| DE | 197 46 893 | 9/2005 |
| EP | 0 230 078 | 7/1987 |
| EP | 1 526 581 | 4/2005 |
| EP | 1526328 | 4/2005 |
| EP | 1 605 524 | 12/2005 |
| JP | 11-340515 * | 12/1999 |
| JP | 2002 094127 | 3/2002 |
| JP | 2002 289926 | 10/2002 |
| WO | WO 00/33390 | 6/2000 |
| WO | WO 2004/066409 | 8/2004 |
| WO | WO 2004/088201 | 10/2004 |

OTHER PUBLICATIONS

I. Schnitzer et al., "30% external quantum efficiency from surface textured, thin-film light-emitting diodes", *Appl. Phys. Lett.*, vol. 63, No. 16, pp. 2174-2176 (Oct. 18, 1993).

* cited by examiner

HOUSING FOR AN ELECTROMAGNETIC RADIATION EMITTING OPTOELECTRONIC COMPONENT, COMPONENT AND METHOD OF MAKING A HOUSING OR A COMPONENT

CROSS REFERENCE TO RELATED APPLICATIONS

Pursuant to 35 U.S.C. §119, this application claims the benefit of German Application No. 102005047153.6, filed Sep. 30, 2005, and German Application No. 102005059524.3, filed Dec. 13, 2005. The contents of the prior applications are incorporated herein by reference in their entirety

TECHNICAL FIELD

This invention relates to a housing for an optoelectronic component suitable for emitting electromagnetic radiation when operating. The invention also encompasses an electromagnetic radiation emitting component provided with such a housing and a method of making such a housing or component.

BACKGROUND

The prior art discloses housings for electromagnetic radiation emitting optoelectronic components comprising a base body that defines a recess. The floor of this recess is provided for mounting a luminescent diode chip. The inner walls of the recess can be shaped in the manner of a reflector, so that a portion of en electromagnetic radiation emitted by the luminescent diode chip can be deflected by the inner walls into a desired solid angle of radiation. An example of a component equipped with such a housing is disclosed in U.S. Pat No. 5,040,868.

Optoelectronic components that emit electromagnetic radiation are finding ever-increasing use in floodlight or projection applications. One example of a floodlight in which electromagnetic radiation emitting luminescent diodes are used is described in DE 10315131 A1. That device is a vehicle headlight in which a plurality of luminescent diode chips are disposed in a common recess. A side of the recess that faces in a light radiation direction has a marginal edge whose spatial arrangement relative to the luminescent diode chip is such that a defined luminance gradient for the distribution of light from the headlight is created in the region of the marginal edges.

In floodlight applications of this kind, it is important for an electromagnetic radiation emitted by the luminescent diode chip to be radiated with the highest possible radiation density and with a given radiation distribution in a given, narrow solid angle. To achieve this, for example beam cones are projected onto a desired plane by means of optics such as projection lenses. In applications of this kind, irregularities in the radiation characteristic of the optoelectronic components used may be intensified and can therefore be especially troublesome. There is, consequently, a demand for components that are specifically tailored to such applications in terms of their radiation properties.

SUMMARY

One object of certain embodiments disclosed herein is to specify a housing of the aforesaid kind which, by technically simple measures, is improved over known housings with respect to the radiation characteristics that can be achieved. The housing is intended in particular to be better suited for floodlight applications. A component provided with such a housing and a method of making such a housing are also to be specified.

A housing of the kind cited at the beginning hereof is specified in which an outer surface disposed on an emission side of the housing is provided at least in part with a baffle layer. The baffle layer is suitable for screening electromagnetic radiation, it being provided in particular to screen externally against electromagnetic radiation generated or to be generated within the housing. In suitable optoelectronic components provided with such a housing, this advantageously sharply reduces or completely prevents the egress of electromagnetic radiation from the housing in an undesired solid angle.

The housing preferably comprises a housing base body provided with a recess in which a chip interconnect area is disposed, the outer surface provided with the baffle layer being disposed adjacent the recess.

In conventional electromagnetic radiation emitting components, it has been found that housing base bodies that are not intended to emit or transmit radiation are often semipermeable to electromagnetic radiation. Particularly when the housings of such housing base bodies have thin walls, the latter are penetrated by some of the electromagnetic radiation generated inside the housing. The electromagnetic radiation consequently is not emitted just within a preferred solid angle.

Such an electromagnetic radiation emitted in a non-preferred or even undesired solid angle is not a problem in many applications, since it accounts for only a very small fraction of the total radiation intensity emitted from the housing. However, laterally emitted electromagnetic radiation has been found to exert an interfering effect, particularly in floodlight and projection applications. This is true for example in applications where it is desired to obtain a beam cone with a well-defined luminance distribution and sharp bright-to-dark transitions.

Providing the outer surface with a baffle layer constitutes a technically simple and efficient means of improving the radiation characteristic of such housings. Advantageously, the application of the baffle layer does not in principle require a special housing design, but can be executed with many conventional housings. The outer surface preferably comprises a region extending perpendicularly to an optical axis of the housing and/or parallel to the chip mounting surface.

In an advantageous embodiment, the housing base body comprises a carrier element on which the chip mounting surface is disposed, and, disposed on the carrier element, a frame element defining the cavity. In this case the baffle layer can be disposed in particular exclusively on the frame element, so that the frame element and the baffle layer can be fabricated independently from the rest of the housing, which can significantly simplify production.

The outer surface preferably adjoins an inner wall of the recess that is configured as a light stop wall suitable for suppressing the emission of radiation from the housing in an undesired spatial region. The baffle layer serves to further suppress or completely eliminate the emission of radiation in these undesired spatial regions.

According to a particularly preferred embodiment, the light stop wall extends substantially at an angle greater than or equal to 80° and smaller than or equal to 100° with respect to the main plane of extension of the chip mounting surface. It is preferably configured as flat, but can also be provided with curvatures or structures. Particularly preferably, the light stop wall extends substantially perpendicularly to the main plane of extension of the chip mounting surface.

The outer surface can be configured as partially or completely flat. Alternatively or additionally, it may be concavely or convexly curved or in some way structured.

The baffle layer is particularly suitable for screening an electromagnetic radiation that encompasses a spectral region of an electromagnetic radiation emitted by a luminescent diode chip provided for a component comprising the housing.

Particularly preferably, the baffle layer is suitable for completely screening an electromagnetic radiation, that is, the baffle layer is particularly preferably impermeable to an electromagnetic radiation having a wavelength range that is to be screened. The wavelength range to be screened can in particular be the entire wavelength range of an electromagnetic radiation emitted by a component that is to produced with the housing. It is also possible for the baffle layer to be partially permeable to electromagnetic radiation, however. It can, for example, be partially permeable to electromagnetic radiation of a wavelength range that is not necessarily to be screened to an electromagnetic radiation that is to be screened. The electromagnetic radiation to be screened is preferably visible light.

The baffle layer for a wavelength range of an electromagnetic radiation which is to be screened and which is emitted by a component equipped with the housing preferably has a total transmittance of 0.2 or less, particularly preferably 0.1 or less. Particularly advantageously, this total transmittance is roughly 0 at least for the visible component of the radiation.

The term "baffle layer" in the present context does not encompass any electrical leads or electrical leadframes of the housing. On the contrary, the outer surface of the housing does not comprise any electrical leadframes or electrical leads, or is provided with at least one baffle layer in addition to any electrical leads or leadframes that may be present.

In one advantageous embodiment, the baffle layer comprises a material that is reflective of the electromagnetic radiation. In this way, the electromagnetic radiation can be reflected back into the housing body by the outer surface and is therefore not necessarily lost to use.

Additionally or alternatively, the baffle layer advantageously comprises a material that is absorptive of the electromagnetic radiation. Suitable absorptive materials can advantageously be particularly inexpensive and can screen the electromagnetic radiation with high efficiency. Particularly preferably, the absorptive material includes a black material, that is, the color of the material is perceivable by the human eye as a shade of black.

In a useful embodiment, the baffle layer is provided with a lacquer. Lacquers are inexpensive materials that can be applied in a technically simple manner.

The housing body usefully comprises ceramic material and/or plastic in the region of the outer surface. Plastics and ceramic materials of the kind used in conventional optoelectronic housings are often partially permeable to electromagnetic radiation, such as for example visible light. Attenuated emission of radiation from the housing base body can be utilized within the scope of the present invention to obtain a well-defined radiation characteristic. The emission of radiation in subregions is further attenuated or completely prevented by the baffle layer, which is a more thoroughgoing way of shaping the radiation characteristic.

A further advantageous embodiment provides that in addition, at least one outer side surface forming part of the housing base body and adjoining the outer surface is provided with a baffle layer. A common baffle layer preferably extends over both the outer surface and the outer side surface. The outer surface and the outer side surface are advantageously provided at substantially the same time.

Particularly advantageously, the outer side surface of the housing is at least partly inclined with respect to a plane extending perpendicularly to a mounting plane of the housing. The outer side surface is inclined in particular such that it at least partly faces away from the mounting plane of the housing. This can be advantageous for the application of the baffle layer, since the inclined portions of the outer side surface do not extend perpendicularly to the mounting plane of the housing and are therefore accessible not only laterally, but also from above. A top side of the housing is to be understood primarily as a side facing away from a mounting plane of the housing.

Particularly preferably, the outer side surface is at least partly inclined at an angle of from 30° to 60° inclusively with respect to the plane extending perpendicularly to a mounting plane of the housing.

Also disclosed is a housing in which the baffle layer advantageously contains or is made of plastic. Plastics can advantageously possess absorptive properties and can be applied for example in the form of a coating.

The electromagnetic radiation emitting optoelectronic component includes the housing and at least one luminescent diode, for example in the form of a luminescent diode chip, which is mounted in the housing.

A method of making a housing for an optoelectronic component or an electromagnetic radiation emitting component is specified. One method step comprises preparing a housing or a component provided with a housing. A further method step includes applying a baffle layer to at least a portion of surfaces of the housing that are disposed on an emission side.

A housing comprising a housing base body provided with a recess is advantageously prepared. The baffle layer is applied to at least one outer surface disposed on an emission side of the housing and adjoining the recess.

Particularly preferably, the application of the baffle layer includes the use of pad printing. Pad printing is an indirect printing process that is particularly suitable for imprinting plastic bodies. Non-planar, for example convexly or concavely arched, surfaces can be provided with a to-be-applied material by pad printing.

Additionally or alternatively, the application of the baffle layer can include the use of at least one of the methods screen printing, inkjet printing, plastic coating and powder coating.

According to a further advantageous embodiment of the method, the application of the baffle layer includes the application of a metal-containing material. This material can be applied in a thick-film process and/or a thin-film process. A thick-film process preferably includes the application of a metal-containing paste. An advantageous thin-film process includes the sputtering of metal-containing material. Alternatively, metal-free materials can be applied by sputtering or the application of a paste.

Further advantages, preferred embodiments and improvements of the housing, the component and the method will become apparent from the exemplary embodiments described hereinafter in conjunction with FIGS. 1 to 13.

DETAILED DESCRIPTION

In the exemplary embodiments and figures, like or like-acting elements are provided with the same respective reference numerals. The elements shown and the size relationships of the elements to one another are not necessarily to be considered true to scale. Rather, individual details of the figures may be depicted as exaggeratedly large to provide a better understanding. This is true in particular of the exemplary depictions of the baffle layer.

Figure 1:
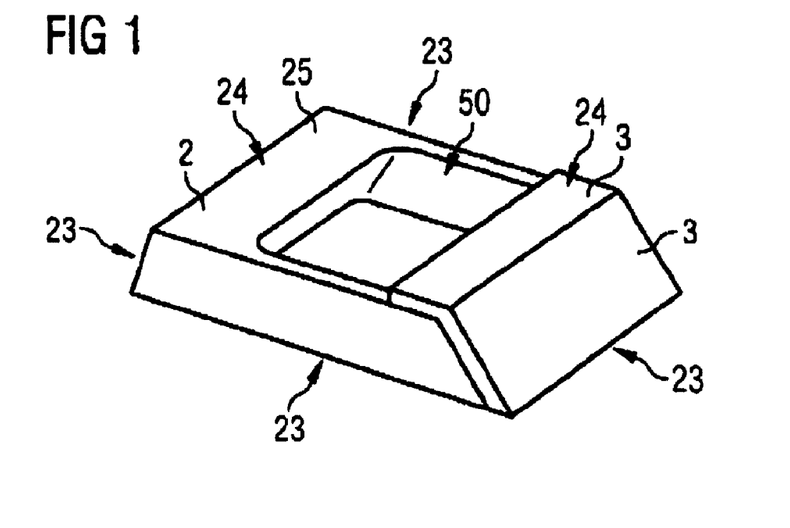
FIGS. 1 to 3 are various schematic perspective representations of a housing according to a first exemplary embodiment.
Figure 2:
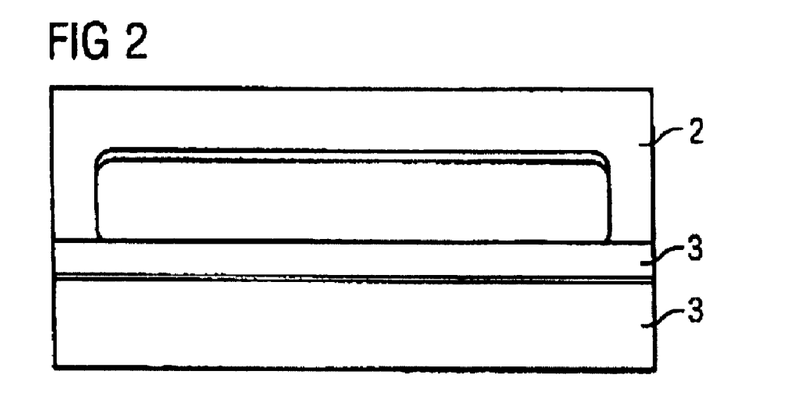
Figure 3:
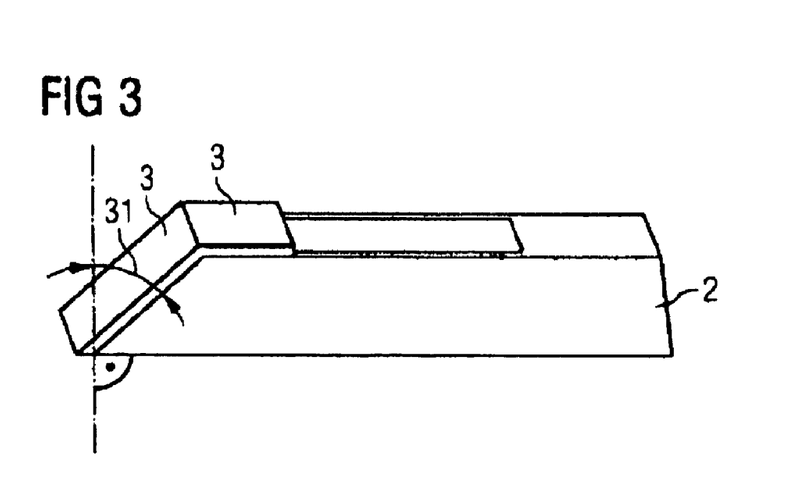

The housing 2 illustrated in FIGS. 1 to 3 comprises a housing body 25 provided with a cavity 50. The opening of the cavity 50 has an elongated cross-sectional area, configured for example in the manner of a rectangle with rounded edges. The cavity 50 is provided to have at least one luminescent diode chip mounted in it and to be electrically conductively connected. The housing illustrated in FIGS. 1 to 3 is provided for example to accommodate four or five luminescent diode chips, which are mounted, for example in a linear arrangement, on a floor of the cavity 50.

The housing body 25 for example contains or is made of a plastic material. A thermoplastic or duroplastic plastic, for example polyphthalamide, is preferably used for this purpose. Fillers can be added to the plastic material. Suitable fillers are for example barium sulfate, anatase (a modification of $TiO_2$) and polytetrafluoroethylene (PTFE, for example Teflon), which are preferably added in a volume ratio of up to 50%. A further preferred volume ratio is in the range of about 5% to about 15%.

The housing 2 comprises, disposed on an emission side, outer surfaces 24 of the housing body 25 that extend perpendicularly to an optical axis of the housing or parallel to a chip mounting surface disposed in the recess 50. One of these outer surfaces 24, which adjoins one of four main edges bounding the recess 50, is provided with a baffle layer 3. Housing body 25 also comprises outer side surfaces 23. The baffle layer 3 also extends over one of these outer side surfaces 23.

In the exemplary embodiment depicted in FIGS. 1 to 3, the baffle layer 3 covers the one outer side surface 23 completely and extends on the front-side outer surface as far as the recess 50. It is also possible, however, for this outer surface and outer side surface 23 to be covered only partially by baffle layer 3. Likewise, it is possible for the side surfaces 23 to be free of a baffle layer. For example, although in the exemplary embodiment of FIG. 1 outer surface 24 is completely covered by baffle layer 3, it may be covered with baffle layer 3 only on its half that adjoins recess 50.

The outer side surface 23 provided with baffle layer 3 is inclined with respect to a plane extending perpendicularly to a mounting plane of the housing. The side surface is configured as flat and is tilted with respect to the plane by an angle 31 (see FIG. 3). Angle 31 is between 30° and 60° inclusively, for example 40°.

Baffle layer 3 is made for example of a reflective material that contains for example a metallic material such as silver. To form the baffle layer, for example a silver layer with a sufficiently high layer thickness is applied to the appropriate surfaces of the housing. Silver has a high reflectivity over a large region of the visible spectrum. The silver layer can be only a few monoparticulate layers thick and can therefore intentionally be left partially permeable to electromagnetic radiation. To achieve complete screening, the thickness must be significantly greater. For this purpose, it has a thickness of for example 10 μm.

Metal-containing layers such as the silver layer can advantageously be applied for example by applying a suitable metal-containing paste or by sputtering. Metal layers can also in principle be vapor-deposited additionally or as an alternative.

The baffle layer 3 can also additionally or alternatively contain an absorptive material. This material can be, for example, another metallic material that has primarily absorptive properties with regard to a given spectral region. Here again, it is important not to apply the absorptive material in too thin a layer if electromagnetic radiation generated inside the housing is to be screened to the greatest possible extent. The baffle layer has for example a total transmittance of 0.05 or less in a wavelength range to be screened. Lacquers or plastics, for example, may also be contemplated for use as the absorptive material.

According to a further exemplary embodiment, the baffle layer 3 comprises a reflective layer which is applied to the appropriate outer surface 24 and outer side surface 23 and to which, in turn, an absorptive layer is applied. The absorptive layer is for example a black lacquer or a black plastic. These are absorptive particularly of visible electromagnetic radiation. The baffle layer 3 can alternatively be composed for example of only one sufficiently thick layer of black lacquer or black plastic.

Figure 4:
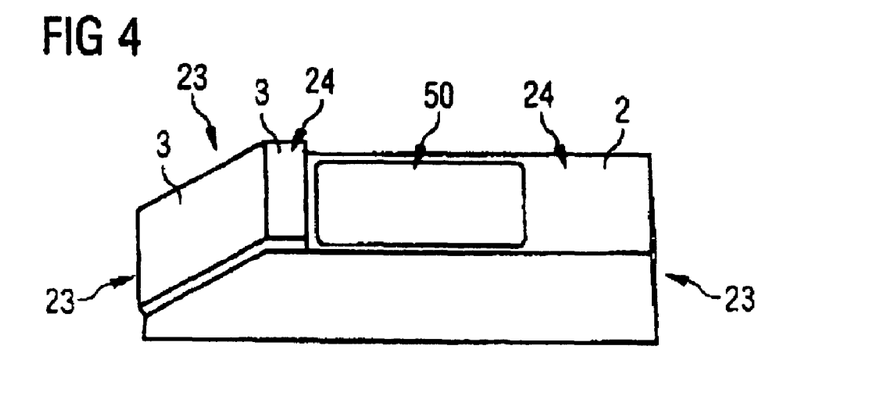
FIGS. 4 and 5 are various schematic perspective representations of a housing according to a second exemplary embodiment.
Figure 5:
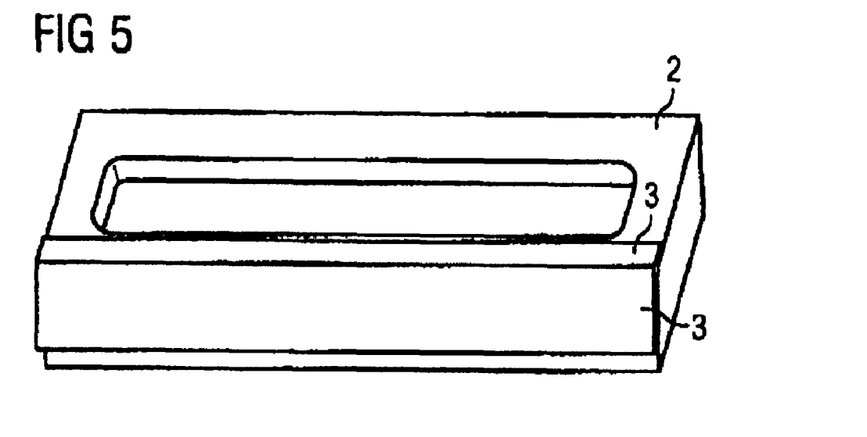

In the housing 2 illustrated in FIGS. 4 and 5, in contrast to the housing described above with reference to FIGS. 1 to 3, the baffle layer 3 is applied to the emission-side outer surface 24 adjoining cavity 50 in such fashion as to be spaced away from the cavity. In other words, baffle layer 3 does not completely cover the outer surface 24 adjoining the cavity, but only a portion of that outer surface that is at a distance from the cavity 50. This can be advantageous if the radiation characteristic to be obtained with the housing is supposed to have a well-defined bright-dark border on at least one side of the emitted beam cone. An overly sharp segment of such a bright-dark border can be attenuated by pulling the baffle layer back from the cavity.

The outer side surface 23 adjoining this outer surface is also covered only partially by a baffle layer 3. The outer side surface 23 partially covered by baffle layer 3 has a first and a second portion. Both portions are for example flatly configured. The first portion extends for example perpendicularly to a mounting plane of the housing 2. The second portion is inclined with respect to the first portion, for example by 55°. This second portion is for example completely covered by baffle layer 3. The first portion is free of the baffle layer. Alternatively, the first portion can also be covered by the baffle layer.

In other respects, the housing 2 depicted in FIGS. 4 and 5 can be configured in the same way as the housing described previously in connection with FIGS. 1 to 3. The same applies to possible compositions, materials and superstructures of baffle layer 3.

Figure 6:
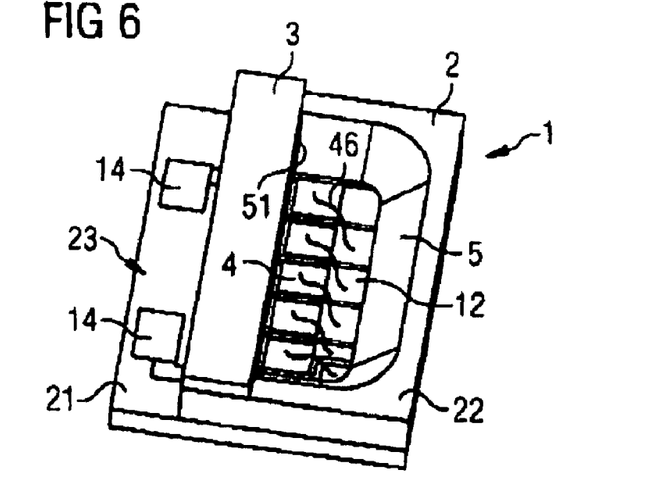
FIG. 6 is a schematic perspective representation of a component according to a first exemplary embodiment and a housing according to a third exemplary embodiment.
Figure 7:
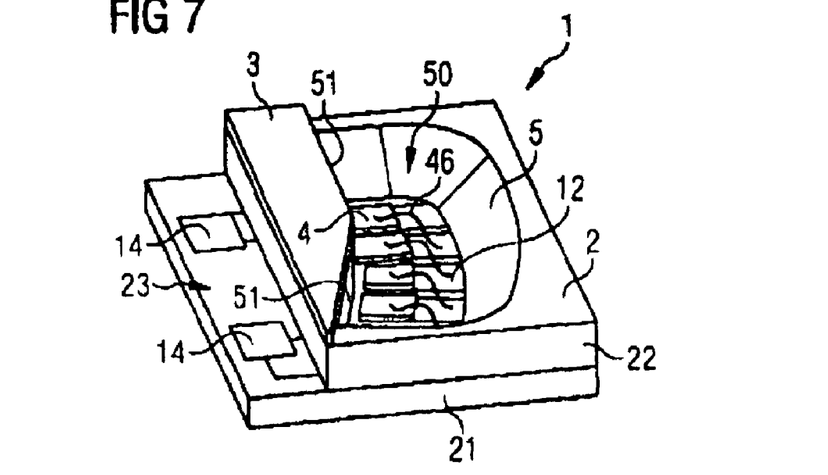
FIG. 7 is a schematic perspective representation of a component according to a second exemplary embodiment and a housing according to a fourth exemplary embodiment.

The components illustrated in FIGS. 6 and 7 comprise a housing 2 with a carrier 21, and, disposed on said carrier 21, a frame 22. Frame 22 comprises inner walls 5 bounding a cavity 50. A plurality of semiconductor chips 4 is disposed in a linear arrangement in the trench-like cavity 50.

The inner walls 5 of the cavity 50 are a relatively small distance away from the luminescent diode chip 4. The distance is, for example, smaller than or equal to a lateral edge length of the luminescent diode chip 4. By the same token, the floor of the cavity 50 has a relatively small area.

The luminescent diode chips 4 are electrically mounted in the housing 2, for example connected to one another in series. To this end, the floor of the cavity 50 comprises a plurality of inner electrical contact surfaces 12, the luminescent diode chips being electrically conductively connected, for example by soldering or conductive glue, for example on their sides facing the floor 54 of cavity 50, to the appropriate inner contact surfaces 12 and resting on a portion of the contact surface 12 concerned. A side of the luminescent diode chip 4 facing away from the inner contact surfaces 12 is electrically conductively connected to the appropriate contact surface, for example by means of a bonding wire 46.

Two of the inner contact surfaces 12 extend across the carrier 21 to a region of the carrier 21 that is offset laterally with respect to the frame 22, and in which they are electrically conductively connected to external contacts 14 of component 1 by means of which the component 1 can be electrically connected to the outside.

When operating, the luminescent diode chips 4 emit for example an electromagnetic radiation in a blue or ultraviolet wavelength range.

The frame for example contains or is made of aluminum oxide. It is also possible alternatively for the frame to contain or be made of a less reflective material, such as for example aluminum nitride or a liquid crystal polymer (LCP). The use of LCP as a material for the frame 22 has the advantage that the material can be thermally matched to the carrier 21. The carrier 21 contains as material for example aluminum nitride, which is inexpensive and has a high thermal conductivity. Silicon or silicon carbide, for example, can also be used as alternative or additional materials for the carrier.

In the component illustrated in FIG. 6, the luminescent diode chips 4 are arranged in a straight line. By contrast, the luminescent diode chips 4 of the component depicted in FIG. 7 are arranged partly along a first straight line and partly along a second straight line, said first and second straight lines forming an angle with each other of for example 15°. The arrangement of the luminescent diode chips 4 therefore comprises a bend.

The housing 2 of the components 1 depicted in FIGS. 6 and 7 has on one side an inner wall bounding the cavity 50 and extending along the arrangement of the luminescent diode chips 4, at least a portion of said inner wall being configured as a light stop wall 51. Such a light stop wall serves to suppress the emission of the radiation in an undesired spatial region. To this end, the light stop wall 51 usefully extends substantially at an angle that is greater than or equal to 80° and less than or equal to 110° with respect to a mounting plane of the luminescent diode chip 4. In particular, the light stop wall extends substantially perpendicularly to the mounting plane.

In the lateral direction, the path of the light stop wall corresponds to the arrangement of the luminescent diode chips. It can also be stated that the luminescent diode chips are arranged along the light stop wall 51. In particular, the lateral path of light stop wall 51 in the exemplary embodiment depicted in FIG. 7 comprises a bend, like the arrangement of the luminescent diode chips. The same is true of an edge of the light stop wall 50 disposed on the opening side of the cavity.

"Lateral direction" should be understood as a direction running parallel to a mounting plane.

Figure 8:
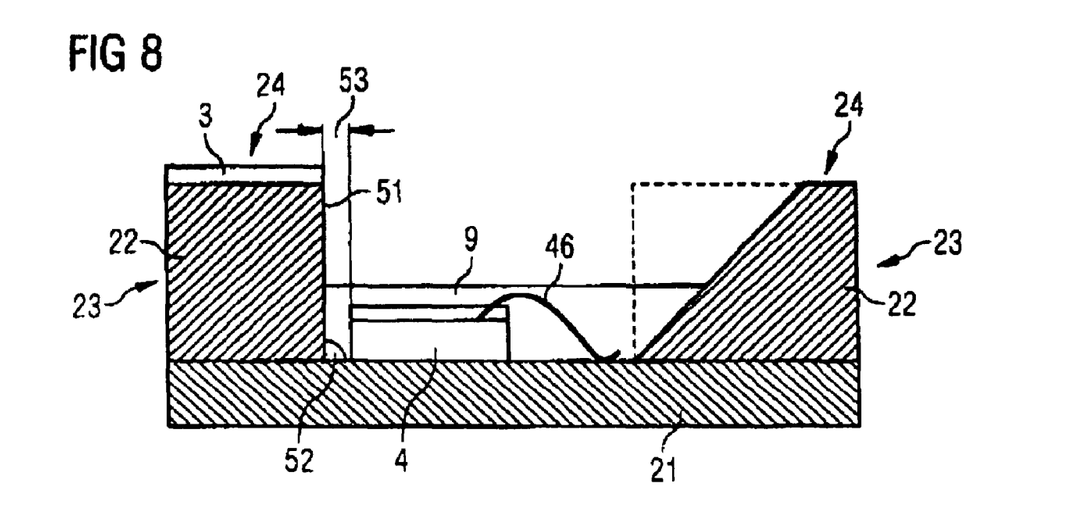
FIG. 8 is a schematic sectional view of a housing according to a fifth exemplary embodiment and a component according to a third exemplary embodiment.

Illustrated in FIG. 8 is a cross section of a component configured in substantially the same way as the components described previously with reference to FIGS. 6 and 7. The cavity's inner wall opposite from light stop wall 51 is configured as a reflector wall, which extends obliquely to the main plane of extension of the carrier 21. It is inclined for example by 45° with respect to the main plane of extension of the carrier. Alternatively, this wall can also be configured as a light stop wall, which can be constituted in the same manner as light stop wall 51. An exemplary cross-sectional shape is indicated in FIG. 8 by broken lines.

The luminescent diode chips 4 are arranged at a distance 53 of for example 500 µm or less, preferably 150 µm or less, from light stop wall 51. Alternatively, to obtain an effective light stop effect, the luminescent diode chip located at the marginal edge of light stop wall 51 that is disposed on the opening side of the cavity can be at a lateral distance of 500 µm or less, preferably of 150 µm or less, from the luminescent diode chips 4, regardless of the path traced by the rest of the light stop wall. The lateral distance in this case is measured in the plane in which the luminescent diode chips are mounted.

Given such a small distance 53, the light stop wall 51 is able to exert an effective light stop effect even if said light stop wall 51 is configured as relatively low. In addition, due to this very small distance, a portion of the electromagnetic radiation emitted by the luminescent diode chips 4 impinges on the light stop wall 51 with a high radiation intensity per unit area, thus largely making it possible to prevent radiation in an undesired solid angle and to emit the electromagnetic radiation in a desired, preferably narrow solid angle and with high emittance.

These properties are desirable particularly in the case of floodlights, for example automobile headlights, which are intended to illuminate a specific solid angle as brightly as possible. In the case of automobile headlights, for example the route being driven, i.e. particularly the road, must be lit as brightly as possible but without blinding oncoming vehicles; consequently, the emission of light in the upper solid angle is undesirable and largely avoided. This is precisely what can be achieved with a component comprising a light stop wall 51. In addition, the stretched-out arrangement of the luminescent diode chips 4 makes it possible to obtain bright and expansive, uniform illumination of the route or road across the entire width of the roadway.

In each of the components 1 depicted in FIGS. 6 to 8, the outer surface 24 of frame 21 that adjoins light stop wall 51 is provided with a baffle layer 3. This can be configured as described earlier hereinabove. The baffle layer 3 is able to more thoroughly prevent radiation emission in an undesired solid angle.

The described housing 2 and components 1 can be used in particular for a floodlight module, particularly for. automotive applications. They can also be suitable for projection applications.

The components 1 emit for example white light, for which purpose they comprise for example a luminescence conversion element that converts the radiation of a first wavelength range emitted by the luminescent diode chips 4 partially into radiation of a second wavelength range different from the first. White light can either be generated by mixing the radiation emitted by the luminescent diode chip with the converted radiation or by having the converted radiation contain color components that yield white light when blended.

The luminescence conversion material can contain at least one phosphor. All converters known for use in LEDs are theoretically suitable. Examples of such phosphors and phosphor mixtures suitable for use as converters are:
- chlorosilicates, as disclosed for example in DE 10036940 and the prior art described therein,
- orthosilicates, sulfides, metal thiols and vanadates, as disclosed for example in WO 2000/33390 and the prior art described therein,
- aluminates, oxides, halophosphates, as disclosed for example in U.S. Pat. No. 6,616,862 and the prior art described therein,
- nitrides, sions and sialons, as disclosed for example in DE 10147040 and the prior art described therein, and
- rare-earth garnets, such as YAG:Ce and the alkaline earth elements, as disclosed for example in US 2004-062699 and the prior art described therein.

The luminescent diode chips 4 can either be potted with a potting compound 9 as illustrated in FIG. 8, for example a silicone-based potting compound, or they can be covered with a radiation-permeable cover plate to protect them against external influences (not illustrated in the figures).

The structure of the housing 2 comprising a carrier 21 and a frame 22 and comprising contact surfaces 12, 14 disposed on the carrier 21 allows the component 1 to be produced in a simple manner, for example with no need for the onerous production of through-connections. Alternatively, however, the housing body can be configured as one piece, for example by overmolding a leadframe that includes respective contacts for the luminescent diode chips 4 and the component 1.

The luminescent diode chips 4 are for example light-emitting diode (LED) chips, and are preferably thin-film LED chips.

A thin-film LED chip is distinguished in particular by the following characteristic features: applied to or formed on a first main surface of a radiation-generating epitaxial layer sequence, which surface faces a carrier element, is a reflecting layer that reflects back into the epitaxial layer sequence at least some of the electromagnetic radiation generated therein; the epitaxial layer sequence has a thickness in the range of 20 µm or less, particularly in the range of 10 µm; and the epitaxial layer sequence comprises at least one semiconductor layer that has at least one surface with an intermixed structure, which in the ideal case brings about a nearly ergodic distribution of the light in the epitaxially grown epitaxial layer sequence, i.e., said layer has a scattering behavior that is as ergodic as possible.

A basic principle of a thin-film LED chip is described, for example, in I. Schnitzer et al., Appl. Phys. Lett. 63 (16), Oct. 18, 1993, 2174-2176, whose disclosure content in that regard is hereby incorporated by reference.

A thin-film LED chip is, as a good approximation, a Lambertian surface radiator, and is therefore particularly well suited for use in the component, particularly for a floodlight.

Figure 9:
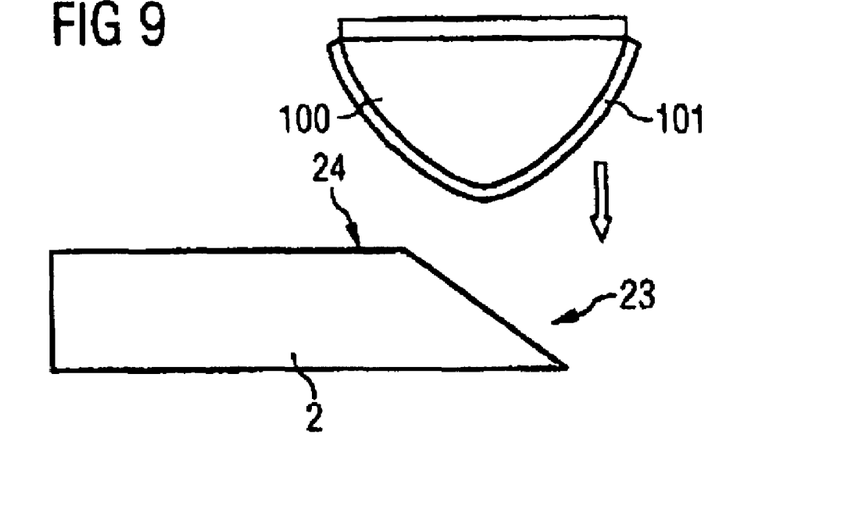
FIGS. 9 to 11 are schematic sectional views of various method stages in an exemplary embodiment of the method.
Figure 10:
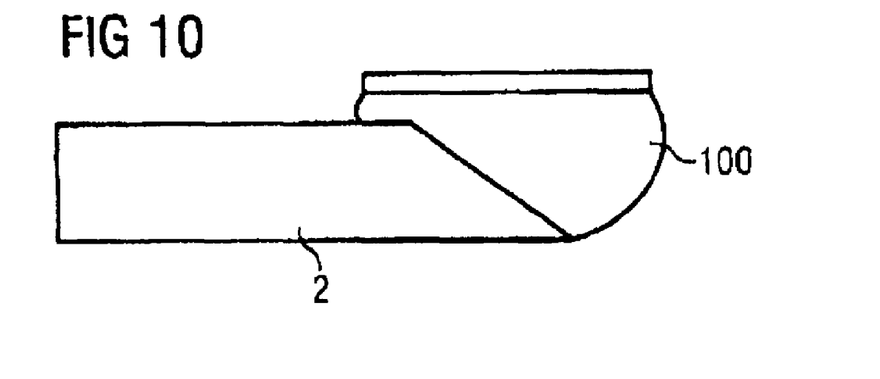

In the previously described exemplary embodiments, at least a portion of the baffle layer 3 or the entire baffle layer 3 can be applied by pad printing. Various method stages of an exemplary such method are depicted in FIGS. 9 to 11.

A pad 100 is provided with a baffle material 101. To this end, the pad is for example pressed onto a device on which the baffle material is disposed. Such devices are known as a printing plate or cliche. The pad 100 is made of a highly elastic material that for example contains or consists of a rubber. Silicone rubber is particularly suitable.

Figure 11:
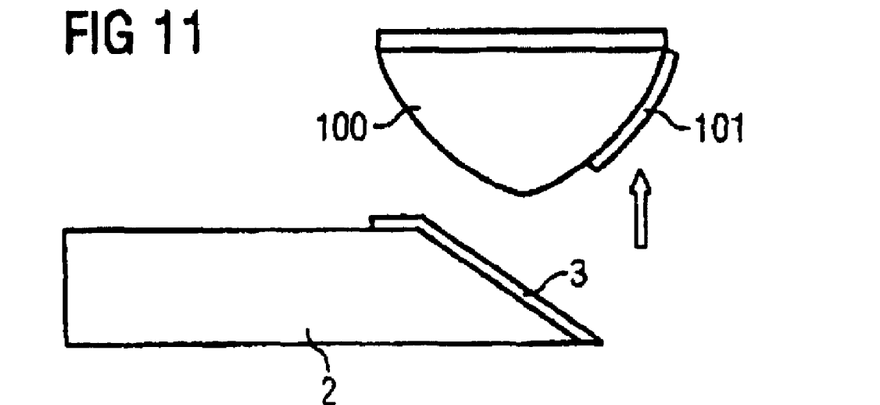

FIG. 11 shows a pad 100 moistened with a baffle material 101, such as for example black dye. The pad 100 is conveyed downward onto the housing 2, so that it comes into contact with an emission-side outer surface 24 and an obliquely extending outer side surface 23 of the housing 2. The direction of movement of the pad 100, which is indicated by an arrow in FIG. 11, extends perpendicularly to a mounting plane of the housing 2. The outer side surface 23 to be imprinted is inclined by an angle of less than 90°, for example 45°, with respect to the direction along which the pad 100 is guided onto the housing 2.

On being pressed against housing 2, pad 100 deforms and molds itself to the external shape of the housing, thus making it possible to imprint outer surface 24 extending perpendicularly to the direction of movement of the pad and obliquely extending outer side surface 23 in one method step (see FIG. 12).

The pad 100 is then conveyed away from the housing 2, as again indicated by an arrow in FIG. 13. The baffle material that comes into contact with the housing 2 when the pad is pressed against it remains adhering to the housing and forms at least part of a baffle layer 3 (see FIG. 13).

These method steps can be repeated as many times as necessary. Such method steps can also be used for example to apply various baffle materials consecutively to corresponding surfaces of the housing 2.

Alternatively to or in addition to pad printing, the baffle layer can also be applied at least in part by screen printing. For this purpose, for example a screen or a mask is applied to the appropriate surfaces of the housing, and a baffle material is then applied to that. The baffle material has a suitable viscosity for screen printing. It can, for example, include a black lacquer or other black colorant. A doctor blade is used to distribute the baffle material present in openings in the screen or mask over the intended surfaces of the housing.

Inkjet printing is also suitable for use as another alternative or complementary method of applying baffle material. Absorptive colorants, in particular, for example black colorant, can be applied in this manner. A conventional CIJ (Continuous Ink Jet) printer can for example be used for this purpose. A DOD (Drop On Demand) printer can also be used.

In addition to or as an alternative to the previously described methods, metal layers, in particular, can be applied by vapor deposition, sputtering or gluing or by the application of a paste.

Plastic coating, for example, is also suitable for the application of baffle material.

Both metal layers and plastic layers can additionally or alternatively be applied for example by powder coating. An electrostatic powder coating or another type of powder coating can be used, for example. In this case the baffle material is applied in the form of a powder. This is then heated, causing it to bond to a for example integral layer and remain adhering to the surface to which it is applied.

The invention is not limited to the exemplary embodiments by the description of it with reference thereto. Rather, the invention encompasses any novel feature and any combination of features, including in particular any combination of features recited in the claims, even if that feature or combination itself is not explicitly mentioned in the claims or exemplary embodiments.

What is claimed is:

1. An electromagnetic radiation emitting component, with at least one luminescent diode and a housing, comprising:
   a housing base body provided with a recess in which at least one chip mounting surface is disposed, on which the luminescent diode is mounted, wherein the housing base body comprises a plurality of outer surfaces, each outer surface being disposed on an emission side of the housing and adjoining said recess,
   wherein at least one of the outer surfaces is provided at least in part with a baffle layer suitable for screening electromagnetic radiation, and at least one of the outer surfaces is free from said baffle layer.

2. The component as in claim 1, characterized in that said outer surface comprises a region extending perpendicularly to an optical axis of said housing and/or parallel to said chip mounting surface.

3. The component as in claim 1, characterized in that said housing base body comprises a carrier element on which said chip mounting surface is disposed and, disposed on said carrier element, a frame element that defines a cavity.

4. The component as in claim 1, characterized in that said outer surface adjoins an inner wall of said recess that is configured as a light stop wall and is suitable for suppressing radiation emission from the housing within an undesired spatial region.

5. The component as in claim 4, characterized in that said light stop wall extends substantially at an angle greater than or equal to 80° and smaller than or equal to 100° with respect to a principal plane of extension of said chip mounting surface.

6. The component as in claim 1, characterized in that said baffle layer comprises a material reflective of said electromagnetic radiation.

7. The component as in claim 1, characterized in that said baffle layer comprises a material absorptive of said electromagnetic radiation.

8. The component as in claim 7, characterized in that said baffle layer comprises a black material.

9. The component as in claim 1, characterized in that said baffle layer comprises a lacquer.

10. The component as in claim 1, characterized in that said housing base body comprises ceramic material in a region covered by said baffle layer.

11. The component as in claim 1, characterized in that said housing base body comprises plastic in a region covered by said baffle layer.

12. The component as in claim 1, characterized in that at least one outer side surface of said housing base body that adjoins said outer surface is additionally provided with a baffle layer.

13. The component as in claim 12, characterized in that said outer side surface is at least partly inclined with respect to a plane extending perpendicularly to a mounting plane of said housing.

14. The component as in claim 13, characterized in that said outer side surface is at least partly inclined with respect to said plane at an angle of 30° to 60°, inclusively.

15. The component as in claim 1, characterized in that said baffle layer comprises or is made of plastic.

16. The component as in claim 1, characterized in that it is configured as a light module for vehicle headlights.

17. The component as in claim 1, wherein exactly one outer surface is provided at least in part with a baffle layer and the remaining outer surfaces are free from said baffle layer.

18. A method of making an electromagnetic radiation emitting component provided with a housing, characterized by the following method steps:
preparing a housing comprising a housing base body provided with a recess and a plurality of outer surfaces, each outer surface being disposed on an emission side of the housing and adjoining said recess,
applying a baffle layer to at least one of the outer surfaces, said baffle layer being suitable for screening an electromagnetic radiation and leaving at least one of the outer surfaces free from said baffle layer.

19. The method as in claim 18, characterized in that the application of said baffle layer includes the use of pad printing.

20. The method as in claim 18, characterized in that the application of said baffle layer includes the use of screen printing.

21. The method as in claim 18, characterized in that the application of said baffle layer includes the use of inkjet printing.

22. The method as in claim 18, characterized in that the application of said baffle layer includes the use of plastic coating.

23. The method as in claim 18, characterized in that the application of said baffle layer includes the use of powder coating.

24. The method as in claim 18, characterized in that the application of said baffle layer includes the application of a paste and/or sputtering.

25. The method as in claim 24, characterized in that the application of said baffle layer includes the application of a metal-containing material by the application of a paste and/or sputtering.

* * * * *